United States Patent
Gronau et al.

(10) Patent No.: US 10,103,005 B2
(45) Date of Patent: Oct. 16, 2018

(54) IMAGING LOW ELECTRON YIELD REGIONS WITH A CHARGED BEAM IMAGER

(71) Applicant: Applied Materials Israel Ltd., Rehovot (IL)

(72) Inventors: Yuval Gronau, Ramat Hasharon (IL); Ishai Schwarzband, Or-Yehuda (IL); Barak Dee-Noor, Herzelia (IL)

(73) Assignee: Applied Materials Israel Ltd., Rehovot (IL)

( * ) Notice: Subject to any disclaimer, the term of this patent is extended or adjusted under 35 U.S.C. 154(b) by 544 days.

(21) Appl. No.: 14/795,877

(22) Filed: Jul. 9, 2015

(65) Prior Publication Data
US 2017/0011881 A1    Jan. 12, 2017

(51) Int. Cl.
| | |
|---|---|
| H04N 7/18 | (2006.01) |
| H01J 37/22 | (2006.01) |
| H01J 37/26 | (2006.01) |
| H01J 37/28 | (2006.01) |
| G06T 7/00 | (2017.01) |

(52) U.S. Cl.
CPC .............. *H01J 37/28* (2013.01); *G06T 7/00* (2013.01); *H01J 2237/221* (2013.01); *H01J 2237/281* (2013.01)

(58) Field of Classification Search
CPC ...... H01J 37/222; H01J 37/26; H01J 2237/28; H04N 7/183
USPC ............................................................ 348/80
See application file for complete search history.

(56) References Cited

U.S. PATENT DOCUMENTS

| | | | | |
|---|---|---|---|---|
| 2007/0194235 A1* | 8/2007 | Kimba | ................. | G01N 23/225 250/310 |
| 2014/0175279 A1* | 6/2014 | Agemura | .............. | H01J 37/244 250/310 |

* cited by examiner

*Primary Examiner* — On S Mung
(74) *Attorney, Agent, or Firm* — Lowenstein Sandler LLP (57) ABSTRACT

Disclosed herein are a system and method for imaging low electron yield regions with a charged beam imager. In certain embodiments, a system may include a processor, wherein the processor comprise an image waveform finder, a synthetic image generator and an output image generator; wherein the processor is configured to (i) receive or generate multiple images of a region of the object; wherein the region has an electron yield that is below an electron yield threshold; (ii) process the multiple images to generate multiple synthetic images, and (iii) generate an output image of the region in response to the multiple synthetic images.

20 Claims, 7 Drawing Sheets

```
┌─────────────────────────────────────────────────────────────────────────────┐
│ Receiving or generating multiple images of a low electron yield region (region) of the object; │
│ the low electron yield region has an electron yield that is below an electron yield threshold. │
│        Each image is generated by scanning the region with an electron beam. 610               │
└─────────────────────────────────────────────────────────────────────────────┘
                                       │
                                       ▼
┌─────────────────────────────────────────────────────────────────────────────┐
│                                                                             │
│  Processing the multiple images to generate multiple synthetic images, wherein each synthetic │
│  image is generated by: (a) processing the image to find at least one image waveform that has a │
│  peak intensity that exceeds an intensity threshold; (b) replacing one or more of the at least one │
│   image waveforms by one or more corresponding synthetic waveforms to provide a synthetic  │
│                                     image. 620                              │
│                                                                             │
│    ┌───────────────────────────────────────────────────────────────────┐    │
│    │   Processing each of the multiple images to find, in each image, at least one image │    │
│    │       waveform that has a peak intensity that exceeds an intensity threshold. 621     │    │
│    └───────────────────────────────────────────────────────────────────┘    │
│                                                                             │
│    ┌───────────────────────────────────────────────────────────────────┐    │
│    │   Generating and/or selecting one or more synthetic waveforms to be used in one or more │    │
│    │                              synthetic images. 622                   │    │
│    └───────────────────────────────────────────────────────────────────┘    │
│                                                                             │
│    ┌───────────────────────────────────────────────────────────────────┐    │
│    │    Determining at least one parameter (such as size and/or shape) of each synthetic  │    │
│    │    waveform in response to at least one of the following: (a) a distribution of image │    │
│    │    waveforms within the certain image, especially the distances between the image │    │
│    │  waveforms, (b) a coverage of the region by a synthetic image that replaces the image, (c) │    │
│    │    a desired transform function and/or bandwidth of at least a portion of a system that │    │
│    │   scanned the region with the electron beam, the portion may be the analog collection path, │    │
│    │              (d) a desired similarity between different synthetic waveforms. 623       │    │
│    └───────────────────────────────────────────────────────────────────┘    │
│                                                                             │
│    ┌───────────────────────────────────────────────────────────────────┐    │
│    │  Replacing each waveform of the certain image by a synthetic waveform. The synthetic │    │
│    │  waveform may be located (in the synthetic image) at the same location as the waveform │    │
│    │                    (in the image) that is being replaced. 624          │    │
│    └───────────────────────────────────────────────────────────────────┘    │
└─────────────────────────────────────────────────────────────────────────────┘
                                       │
                                       ▼
┌─────────────────────────────────────────────────────────────────────────────┐
│   Generating an output image of the region in response to the multiple synthetic images. 630 │
└─────────────────────────────────────────────────────────────────────────────┘

```
┌─────────────────────────────────────────────────────────────────────────────┐
│ Receiving or generating multiple images of a low electron yield region      │
│ (region) of the object; the low electron yield region has an electron yield │
│ that is below an electron yield threshold. Each image is generated by       │
│ scanning the region with an electron beam. 610                              │
└─────────────────────────────────────────────────────────────────────────────┘
                                      │
                                      ▼
┌─────────────────────────────────────────────────────────────────────────────┐
│ Evaluating one or more attributes of one or more of the multiple images. 710│
└─────────────────────────────────────────────────────────────────────────────┘
                                      │
                                      ▼
┌─────────────────────────────────────────────────────────────────────────────┐
│ Processing the multiple images to generate multiple synthetic images,       │
│ wherein each synthetic image is generated by: (a) processing the image to   │
│ find at least one image waveform that has a peak intensity that exceeds an  │
│ intensity threshold; (b) replacing one or more of the at least one image    │
│ waveforms by one or more corresponding synthetic waveforms to provide a     │
│ synthetic image. 620                                                        │
│  ┌───────────────────────────────────────────────────────────────────────┐  │
│  │ Processing each of the multiple images to find, in each image, at     │  │
│  │ least one image waveform that has a peak intensity that exceeds an    │  │
│  │ intensity threshold. 621                                              │  │
│  └───────────────────────────────────────────────────────────────────────┘  │
│  ┌───────────────────────────────────────────────────────────────────────┐  │
│  │ Generating and/or selecting one or more synthetic waveforms to be     │  │
│  │ used in one or more synthetic images. 622                             │  │
│  └───────────────────────────────────────────────────────────────────────┘  │
│  ┌───────────────────────────────────────────────────────────────────────┐  │
│  │ Determining at least one parameter (such as size and/or shape) of each│  │
│  │ synthetic waveform in response to at least one of the following: (a) a│  │
│  │ distribution of image waveforms within the certain image, especially  │  │
│  │ the distances between the image waveforms, (b) a coverage of the      │  │
│  │ region by a synthetic image that replaces the image, (c) a desired    │  │
│  │ transform function and/or bandwidth of at least a portion of a system │  │
│  │ that scanned the region with the electron beam, the portion may be the│  │
│  │ analog collection path, (d) a desired similarity between different    │  │
│  │ synthetic waveforms. 623                                              │  │
│  └───────────────────────────────────────────────────────────────────────┘  │
│  ┌───────────────────────────────────────────────────────────────────────┐  │
│  │ Replacing each waveform of the certain image by a synthetic waveform. │  │
│  │ The synthetic waveform may be located (in the synthetic image) at the │  │
│  │ same location as the waveform (in the image) that is being replaced.624│  │
│  └───────────────────────────────────────────────────────────────────────┘  │
└─────────────────────────────────────────────────────────────────────────────┘
                                      │
                                      ▼
┌─────────────────────────────────────────────────────────────────────────────┐
│ Generating an output image of the region in response to the multiple        │
│ synthetic images. 630                                                       │
└─────────────────────────────────────────────────────────────────────────────┘
                                      │
                                      ▼
┌─────────────────────────────────────────────────────────────────────────────┐
│ Evaluating one or more attributes of one of more of the output image. 740   │
└─────────────────────────────────────────────────────────────────────────────┘
                                    800
```

FIG. 7

IMAGING LOW ELECTRON YIELD REGIONS WITH A CHARGED BEAM IMAGER

BACKGROUND OF THE INVENTION

Objects such as wafers are manufactured by highly complicated manufacturing processes. These manufacturing processes should be monitored in order to ensure the quality of the wafers.

The monitoring process may include a first phase of optical, ultraviolet, deep ultraviolet or extreme ultraviolet inspection to detect potential defects and a second phase of defect review.

Defect review is usually executed by a scanning electron microscope (SEM) that exhibits a very high resolution (nanometric order). A SEM usually acquires multiple images of the same area (multiple consecutive scans of the area) and then averages these multiple images to provide an output image of the area. The output image can be displayed to an operator. The operator is expected to evaluate the area in view of the output image.

A high aspect ratio holes such as a deep trench or a deep void, may have an aspect ratio exceeds 20. The high aspect ratio and the small width of the high aspect ratio hole cause the bottom of the high aspect ratio hole to exhibit a very low electron yield. The electron yield of the bottom of the high aspect ratio hole is the ratio between (a) a number of electrons that originate from the bottom of the high aspect ratio hole and are detected by the SEM as a result of an irradiation of the high aspect ratio hole and (b) the number of electrons that irradiate the high aspect ratio hole.

Other non-limiting examples of low electron yield structures include vertical NAND memory structures and trenches.

A most common imaging mode of a SEM includes collecting secondary electrons. These secondary electrons are accelerated and are detected by detector that may include a scintillator (for converting a secondary electron to a photon) and a photomultiplier (for amplifying the photon and outputting an electrical signal). The acceleration process, the conversion of a secondary electron to a photon and the amplification of the photon are noisy and inconsistent analog processes that result in a noisy and fluctuating analog signal of low signal to noise ratio.

There is a growing need to improve the review of low electron yield regions such as but not limited high aspect ratio holes.

SUMMARY

According to an embodiment of the invention there may be provided a method for imaging an object, the method may include receiving or generating multiple images of a region of the object; wherein the region has an electron yield that is below an electron yield threshold; wherein each image is generated by scanning the region with an electron beam; processing the multiple images to generate multiple synthetic images, wherein each synthetic image is generated by: (a) processing the image to find at least one image waveform that has a peak intensity that exceeds an intensity threshold; (b) replacing one or more of the at least one image waveforms by one or more corresponding synthetic waveforms to provide a synthetic image; and generating an output image of the region in response to the multiple synthetic images.

A synthetic waveform that replaces an image waveform may be smoother than the image waveform.

The at least one certain image waveform that (a) has a peak intensity that exceeds the intensity threshold, and (b) belongs to a certain image of the multiple images, is generated in response to a detection of an emission of a single electron from the region.

Each image waveform may be a pulse. The method may include filtering out secondary oscillations associated with each pulse.

The method may include determining at least one parameter of at least one synthetic image of a certain image in response to a distribution of image waveforms within the certain image.

The method may include determining a width of a synthetic waveform of a certain image in response to a distance between an image waveform associated with the synthetic waveform and another image waveform of the certain image.

The method may include determining at least one parameter of at least one synthetic waveform of a certain image to provide a full coverage of the region by the synthetic image.

The method may include determining at least one parameter of at least one synthetic waveform of a certain image in response to a desired transform function of at least a portion of a system that scanned the region with the electron beam.

The portion of the system may be an analog collection path of the system.

The method may include determining at least one parameter of at least one synthetic waveform of a certain image in response to a desired bandwidth of at least a portion of a system that scanned the region with the electron beam.

The method may include determining at least one parameter of at least one synthetic waveform of a certain image in response to a signal to noise ration (SNR) of the certain image.

The method may include determining at least one parameter of at least one synthetic waveform of a certain image in response to an SNR of at least one of the multiple images.

All synthetic waveforms of a certain image may have a same height.

At least two synthetic waveforms of a certain image may differ from each other by height.

All synthetic waveforms of all of the multiple images may have a same height.

At least two synthetic waveforms of the multiple images may differ from each other by height.

All synthetic waveforms of a certain image may have a same shape.

All synthetic waveforms of all of the multiple images may have a same shape.

All synthetic waveforms of all of the multiple images may have a same size.

At least two synthetic waveforms of the multiple images may differ from each other by shape.

At least one synthetic waveform may have a Gaussian shape.

At least one synthetic waveform may be delta function.

A number of electrons per pixel of each image may not exceed five, may equal five or may exceed five.

The number of electrons per pixel of each image may not exceed one, may equal one or may exceed one.

The method may include receiving or generating multiple images of an area of the object; wherein the area may include the region and another region that has an electron yield that is above the electron yield threshold; wherein each image of the area is generated by scanning the area with the electron beam; wherein the generating an output image of the area is responsive to the multiple synthetic images and to multiple images of the other region.

The method may include finding the region and the other region.

At least one certain image waveform that (a) has a peak intensity that exceeds the intensity threshold, and (b) belongs to a certain image of region, is generated in response to a detection of an emission of a single electron from the region; wherein each waveform of each image of the other region is generated in response to a detection of an emission of multiple electrons from the other region.

The electron yield of the other area is at least 200 bigger than the electron yield of the region.

The method may include generating each of the multiple synthetic images by utilizing one or more primitive synthetic waveforms; summing the multiple synthetic images to provide a summed image and filtering the summed image to provide the output image.

According to an embodiment of the invention there may be provided a non-transitory computer readable medium that stores instructions that once executed by a computer cause the computer to: receive or generate multiple images of a region of the object; wherein the region has an electron yield that is below an electron yield threshold; wherein each image is generated by scanning the region with an electron beam; process the multiple images to generate multiple synthetic images, wherein each synthetic image is generated by: (a) processing the image to find at least one image waveform that has a peak intensity that exceeds an intensity threshold; (b) replacing one or more of the at least one image waveforms by one or more corresponding synthetic waveforms to provide a synthetic image; and generate an output image of the region in response to the multiple synthetic images.

According to an embodiment of the invention there may be provided a system, may include a processor, wherein the processor comprise an image waveform finder, a synthetic image generator and an output image generator; wherein the processor is configured to (i) receive or generate multiple images of a region of the object; wherein the region has an electron yield that is below an electron yield threshold; wherein each image is generated by scanning the region with an electron beam; (ii) process the multiple images to generate multiple synthetic images, and (iii) generate an output image of the region in response to the multiple synthetic images; wherein the image waveform finder is configured to process each image of the multiple images to find at least one image waveform that has a peak intensity that exceeds an intensity threshold; wherein the synthetic image generator is configured to replace one or more of the at least one image waveforms by one or more corresponding synthetic waveforms to provide a synthetic image; and wherein the output image generator is configured to generate an output image of the region in response to the multiple synthetic images

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 1:
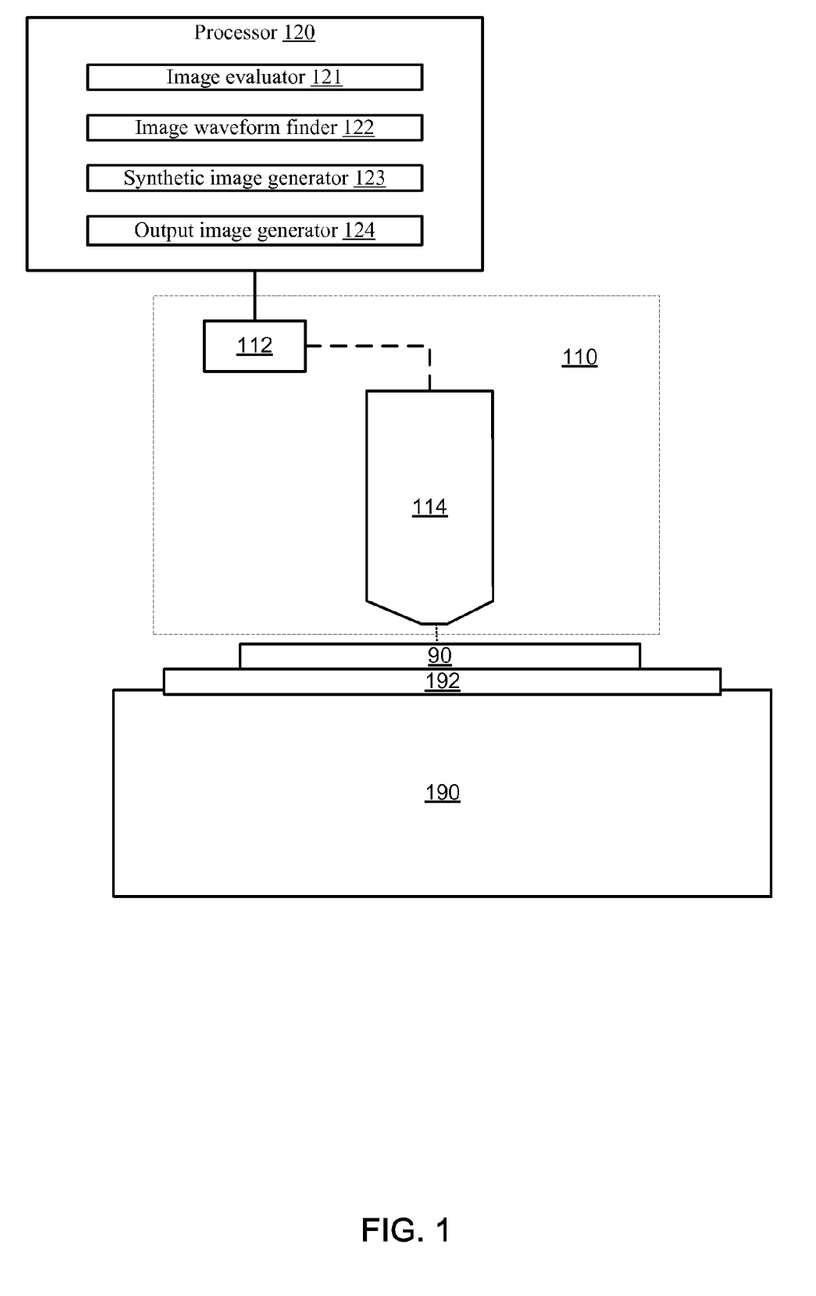
FIG. 1 illustrates a system according to an embodiment of the invention.

FIG. 1 illustrates system 100 according to an embodiment of the invention.

FIG. 1 illustrates system 100 as being a charged particles imager such as but not limited to a scanning electron microscope (SEM) or an electron beam inspection system.

System 100 includes an image obtaining module 110, processor 120 and a mechanical stage 192 for supporting and moving an object 90. The object may be a wafer, a die or any other object.

Image obtaining module 110 may include a controller 112 and charged particles optics 111 that are arranged to illuminate the object 90, one area after the other. The image obtaining module 110 may scan the object 90 by using one or more scan patterns. A non-limiting example of a scan pattern is a raster scan pattern.

An area of the object may correspond to a field of view of the charged particle optics 111. For example—a field of view of the charged particle optics 111 may cover a single area of the object. Alternatively—the field of view may include multiple areas and/or less than an area.

Each area of the object may include one or more regions of low electron yield and one or more regions of high electron yield. An electron yield of a region is a ratio between (a) a number of electrons that are detected by image obtaining module as a result of an illumination of the region, and (b) a number of electrons that illuminated the region. Low electron yield region may have an electron yield ratio that is lower than a predefined threshold such as but not limited 0.1, 0.01 or even a lower predefined threshold.

Usually, at a normal scan rate an image of a low electron yield region will be include up till few electrons (for example five, one) per pixel. For example, if the primary beam current is 10 pA, the yield is 0.01, the collection efficiency is 50% and the integration time is 5 nsec, then the average number of electrons per pixel is in the order of 0.0016, i.e. one electron for every 600 pixels.

Figure 2:
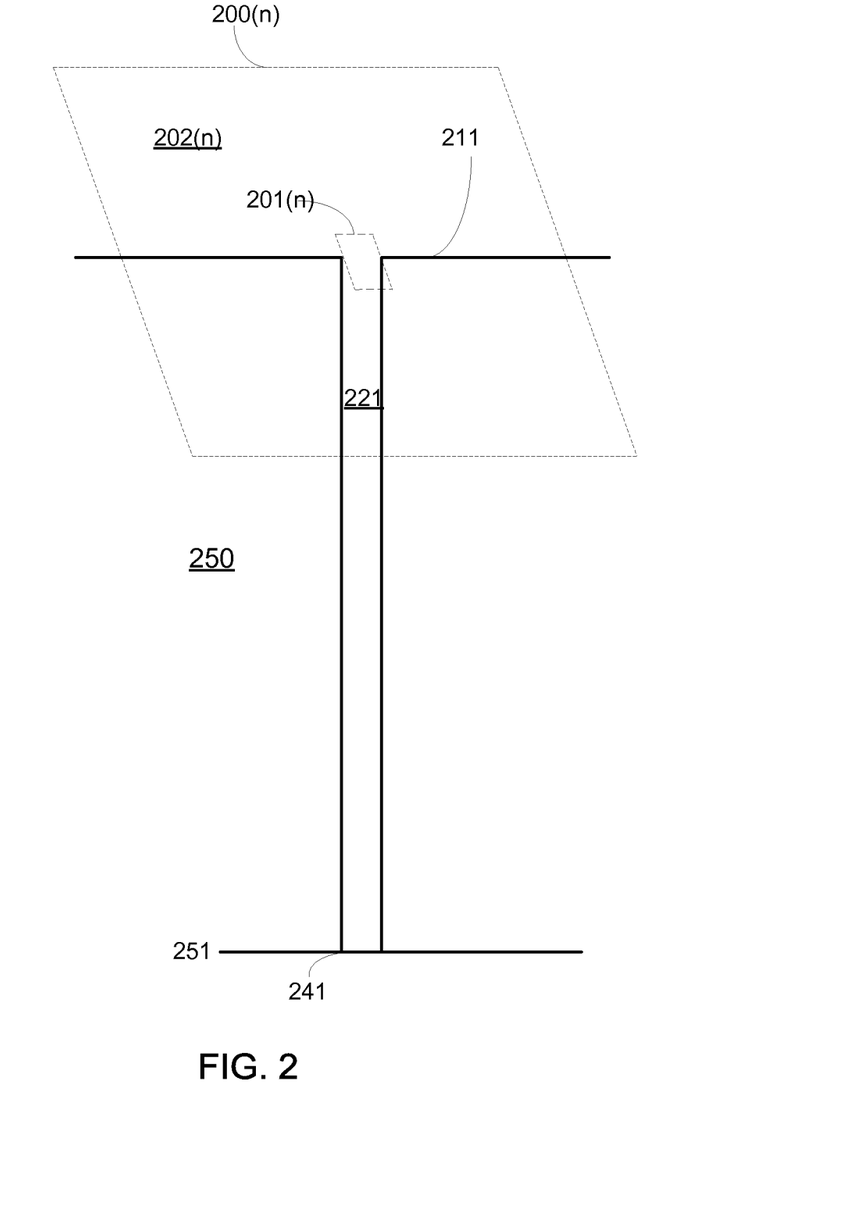
FIG. 2 illustrates a high aspect ratio hole, an area of an object that includes the high aspect ratio hole and various images.

A low electron yield region may be a bottom of a high aspect ratio hole. A high electron yield region may be an upper surface that surrounds the high aspect hole. FIG. 2 illustrates a high aspect ratio hole 221 that has a bottom 241. The high aspect ratio hole 221 is formed within a medium 250. The high aspect ratio hole 221 is surrounded by the upper surface 211 of the medium 250. FIG. 2 also shows an image 201(n) of the high aspect ratio hole 221 that is included in an image 200(n) of an area of the object. The image of the area also includes an image 202(n) of a high electron yield region—which is the upper surface 211.

The difference between the yields of a low electron yield region and a high electron yield region may exceed a factor of 10, 100, 1000 and even more.

The low number of electrons per pixels results in a very noisy image. Each one of the few electrons passes through an analog collection path of the image obtaining module 110. This analog collection path exhibits an inconsistent response to electrons and thus the image of a low electron yield region may fluctuate due to this inconsistency. Furthermore—the low number of electrons means that the image of the low electron yield region has a low signal to noise ratio and thus is very noisy.

Referring back to FIG. 1—according to an embodiment the processor 120 is configured to overcome these problems by processing images acquired by the image obtaining module 110.

The processor 120 may, for example, (i) receive or generate multiple images of a low electron yield region (region) of the object; the low electron yield region has an electron yield that is below an electron yield threshold; wherein each image is generated by scanning the region with an electron beam; (ii) process the multiple images to generate multiple synthetic images, wherein each synthetic image is generated by: (a) processing the image to find at least one image waveform that has a peak intensity that exceeds an intensity threshold; (b) replacing one or more of the at least one image waveforms by one or more corresponding synthetic waveforms to provide a synthetic image; and (ii) generate an output image of the region in response to the multiple synthetic images.

According to an embodiment of the invention a synthetic waveform that replaces an image waveform may be smoother than the image waveform.

According to an embodiment of the invention at least one of the shape of a synthetic waveform, any dimension (width, length) of the synthetic waveform, the smoothness of the synthetic waveform can be set according to one or more requirements. The one or more requirements may define a desired property of the synthetic waveform. The desired property may be a signal to noise ratio, bandwidth, noise level, smoothness or any other desired property.

According to an embodiment of the invention at least one of the shape of a synthetic waveform, any dimension (width, length) of the synthetic waveform, the smoothness of the synthetic waveform or any other property of the synthetic waveform may be responsive to the locations that are being scanned or to any other property of the locations that are being scanned. For example, the synthetic waveform can be sharper near edges and smoother in smooth locations.

FIG. 1 illustrates the processor 120 as including an image evaluator 121, an image waveform finder 122, a synthetic image generator 123 and an output image generator 124.

The image evaluator 121 may be configured to evaluate one or more attributes of one of more of the multiple images. An attribute may be, for example, a signal to noise ratio, a smoothness of the image, and the like.

The image waveform finder 122 may be configured to process each of the multiple images to find, in each image, at least one image waveform that has a peak intensity that exceeds an intensity threshold. The intensity threshold may be set in order to filter out noises that have a peak intensity that is below a minimal peak intensity of a signal resulting from a detection of an electron. The intensity threshold may be adjusted over time. The adjustment of the intensity thresholds may be responsive to evaluations about false alarms (declaring noise as a valid waveform) or evaluations about missed electrons (filtering valid signals).

The synthetic image generator 123 may be configured to generate multiple synthetic images.

The synthetic image generator 123 may be arranged to generate and/or select one or more synthetic waveforms to be used in one or more synthetic images.

The synthetic image generator 123 may be arranged to determine at least one parameter (such as size and/or shape) of each synthetic waveform in response to at least one of the following: (a) a distribution of image waveforms within the certain image, especially the distances between the image waveforms, (b) a coverage of the region by a synthetic image that replaces the image (it may be desired not to have gaps in the synthetic image), (c) a desired transform function and/or bandwidth of at least a portion of a system that scanned the region with the electron beam, the portion may be the analog collection path, (d) one or more attributes (such as signal to noise ratio) of one or more images of the multiple images, (e) a desired similarity between different synthetic waveforms (for example—all the synthetic waveforms applied in all synthetic images may be of the same shape and/or size, alternatively—at least two synthetic waveforms may differ from each other by shape and/or size).

For example if there are greater distances between adjacent image waveforms than the synthetic pulses may be wider.

Yet for another example, lower SNRs may require smoother synthetic waveforms.

The synthetic image generator 123 may be arranged to generate a Gaussian shaped synthetic waveforms, a delta shaped synthetic waveform, a synthetic waveform that has a shape that approximates a transfer function of the image obtaining module 110 (or of a portion of the image obtaining module 110), and the like.

The synthetic image generator 123 may be configured to use the one or more waveforms when it generates the multiple synthetic images, in response to information about at least one image waveform found within each image.

Each synthetic image corresponds to an image of the multiple images. The synthetic image generator 123 may be configured to generate a certain synthetic image in responsive to one or more synthetic waveforms associated with a certain image and to information about one or more waveforms found within the certain image.

The synthetic image generator 123 may be configured to replace each waveform of the certain image by a synthetic waveform. The synthetic waveform may be located (in the synthetic image) at the same location as the waveform (in the image) that is being replaced.

The output image generator 124 may be configured to output an output images in response to the multiple synthetic images. For example—the output image generator 124 may be configured to accumulate the multiple synthetic images (or apply any mathematical function on the multiple synthetic images) to provide the output image.

The output image generator 124 may generate the output image by summing multiple images with primitive synthetic waveforms (delta-pulses or other low complexity synthetic waveform) to provide a summed image and then filter the summed image. Alternatively, the output image generator may apply more complicated synthetic waveforms (kernels) in each of multiple images. Processing the summed image may be simpler to apply.

According to an embodiment of the invention the image evaluator 121 may also be configured to evaluate one or more attributes of one of more of the output image. This evaluation may affect the generation of future synthetic waveforms. For example—if the output image exhibits a low SNR it may be beneficial to use the synthetic waveforms that were used during the generation of the synthetic images that are associated with the output image.

According to an embodiment of the invention the processor 120 may receive images of an area of the object, wherein the area may include one or more low electron yield regions and one or more high electron yield regions.

For example—an area may include a high aspect ratio hole and its surroundings. The bottom of the high aspect ratio hole is a low electron yield region and the surroundings are the high electron yield region.

In this case the processor 120 may be configured to (a) detect the high electron yield region and the low electron yield region, (b) replace the images of the low electron yield region by synthetic images (for example—by applying the process mentioned above), (c) apply another process (such as filtering) on the images of the high electron yield region or prevent from applying any process on the images of the high electron yield region, and (d) generate the output image in response to the multiple synthetic images and the images (or processed images) of the high electron yield region.

According to various embodiment of the invention the replacement of one or more of the at least one image waveforms by one or more corresponding synthetic waveforms to provide a synthetic image may reduce and even eliminate additive electronic noise, multiplicative component of noise caused by random response of detector (scintillator) and multiplicative component of noise caused be random response of electronics (PMT).

Figure 3:
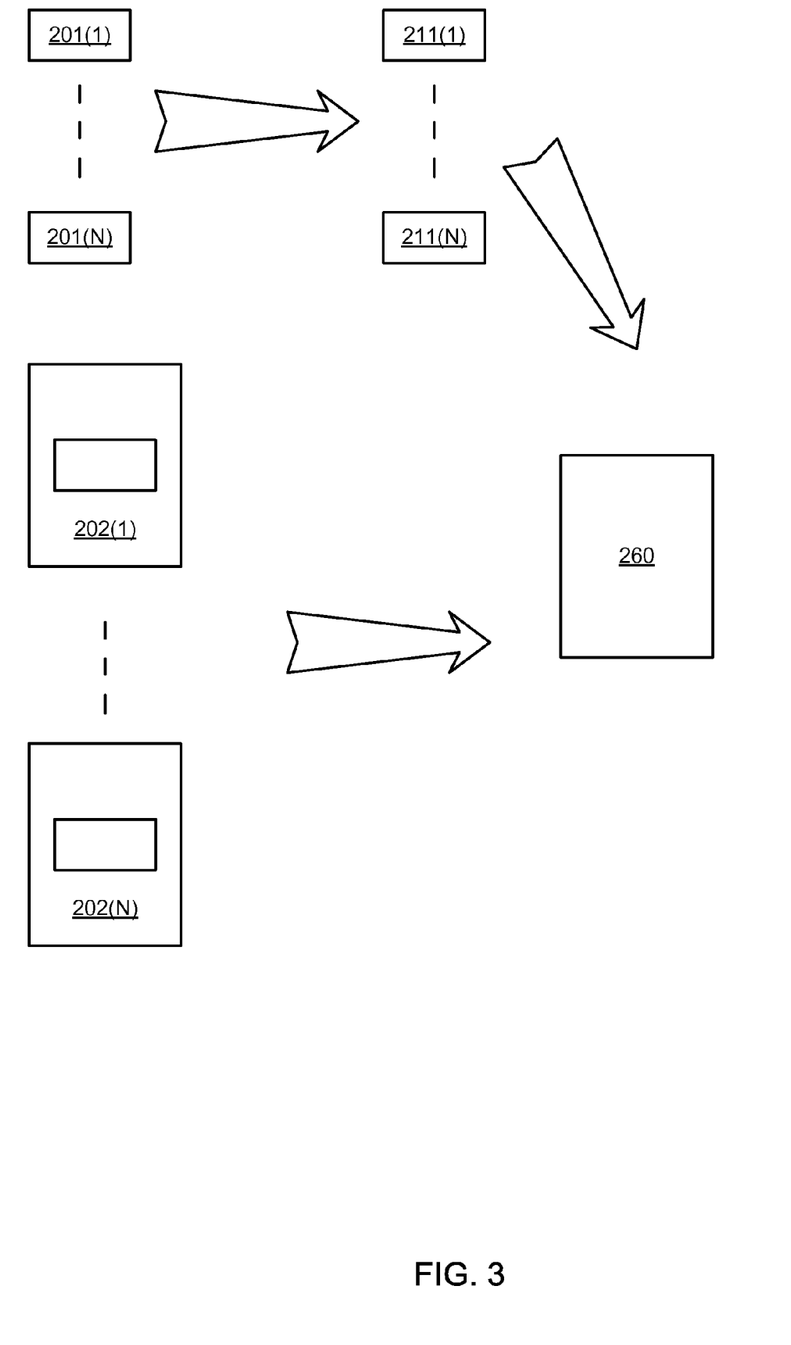
FIG. 3 illustrates a multiple images, multiple synthetic images and an image of an area according to an embodiment of the invention.

FIG. 3 illustrates multiple (N) images 201(1)-201(N) of a low electron yield region that are processed to provide multiple synthetic images 211(1)-211(N). N images 202(1)-202(N) of a high electron yield region that surrounds the low electron yield region are also acquired. The output image 260 of an area (the area includes the high and low electron yield regions) is generated in response to multiple synthetic images 211(1)-211(N) and to the multiple images 202(1)-202(N) of the high electron yield region. FIG. 3 also shows that output image 260 includes an output image 261 of the low electron yield region.

Figure 4:
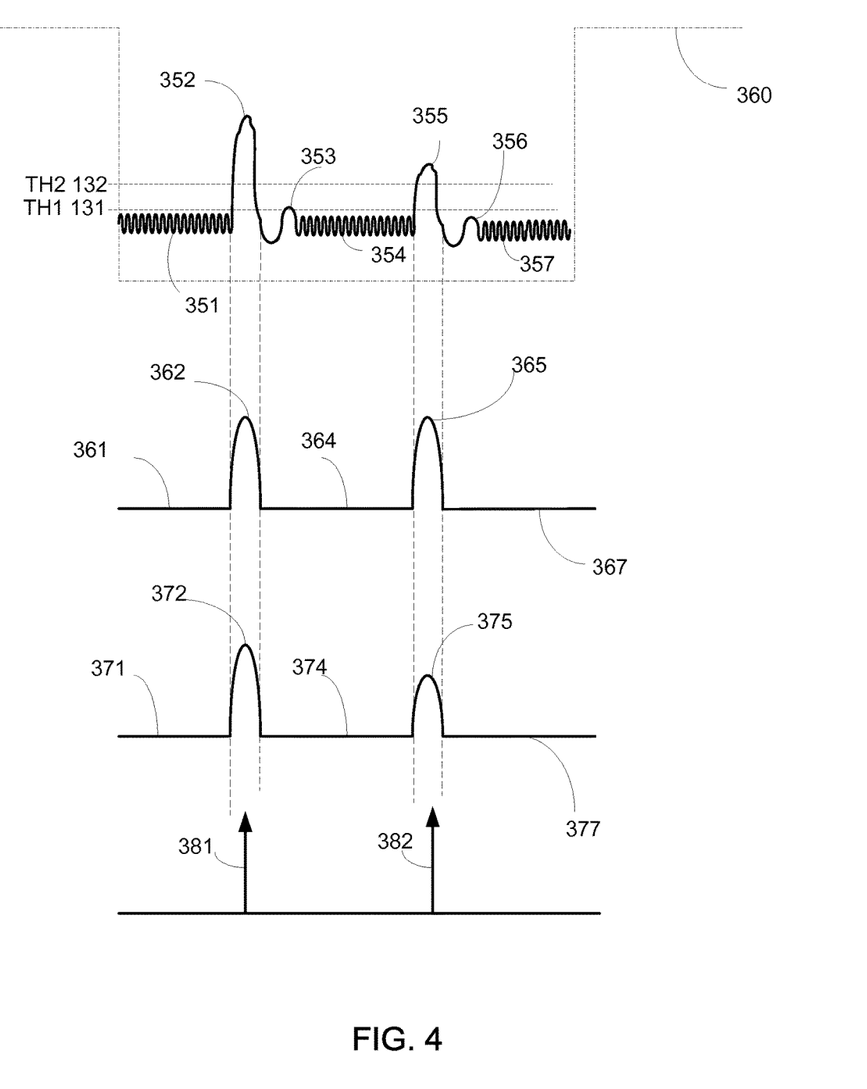
FIG. 4 illustrates detection signals and synthetic waveforms according to an embodiment of the invention.

FIG. 4 illustrates noisy detection signals that form a row of an image of a low electron yield region according to an embodiment of the invention.

The noisy detection signals include a first noisy portion 351 (includes only noise) that is followed by a first noisy pulse 352, a noisy secondary oscillation 353, a second noisy portion 354 (includes only noise), a second noisy pulse 355, another noisy secondary oscillation 356, and a third noisy portion 357 (includes only noise). First noisy pulse 352 has a peak value that exceeds the peak value of the second noisy pulse 355.

FIG. 4 also illustrates two thresholds TH1 131 and TH2 132. Either one of these thresholds may when the detection signals are thresholds to detect waveforms that have a peak level above a threshold.

When using first threshold TH1 131 the following waveforms are detected—first and second noisy pulses 352 and 355 and noisy secondary oscillation 353. The noisy secondary oscillation 353 may be filtered out due to its proximity to first noisy pulse 352.

When using second threshold TH2 132 the following waveforms are detected—first and second noisy pulses 352 and 355.

First and second noisy pulses 352 and 355 may be replaced by synthetic waveforms 362 and 365 of the same height, while first, second and third noisy portions 351, 354 and 357 may be replaced by smooth horizontal lines 361, 364 and 367.

First and second noisy pulses 352 and 355 may be replaced by synthetic waveforms 372 and 375 of different heights, while first, second and third noisy portions 351, 354 and 357 may be replaced by smooth horizontal lines 371, 374 and 377.

Simulation made by the inventors have shown that using synthetic waveforms with the same height improved the SNR by a factor of 1.36 and that using synthetic waveforms of different heights has also improved the SNR. An improvement of the SNR by 1.36 represent a reduction of about 1.85 in the image acquisition time.

FIG. 4 also shows information about the waveforms—the location of the first and second noisy pulses 352 and 355 may be represented by pointers 381 and 382 respectively.

It is noted that the processor 320 may be a computer that is not a part of a scanning electron microscope. The processor 320 may include one or more hardware processing units such as general purpose processors, central processing units, digital signals processor and the like. The processor

320 may include (or may be coupled to) memory units for storing images, synthetic images, code, and the like.

Figure 5:
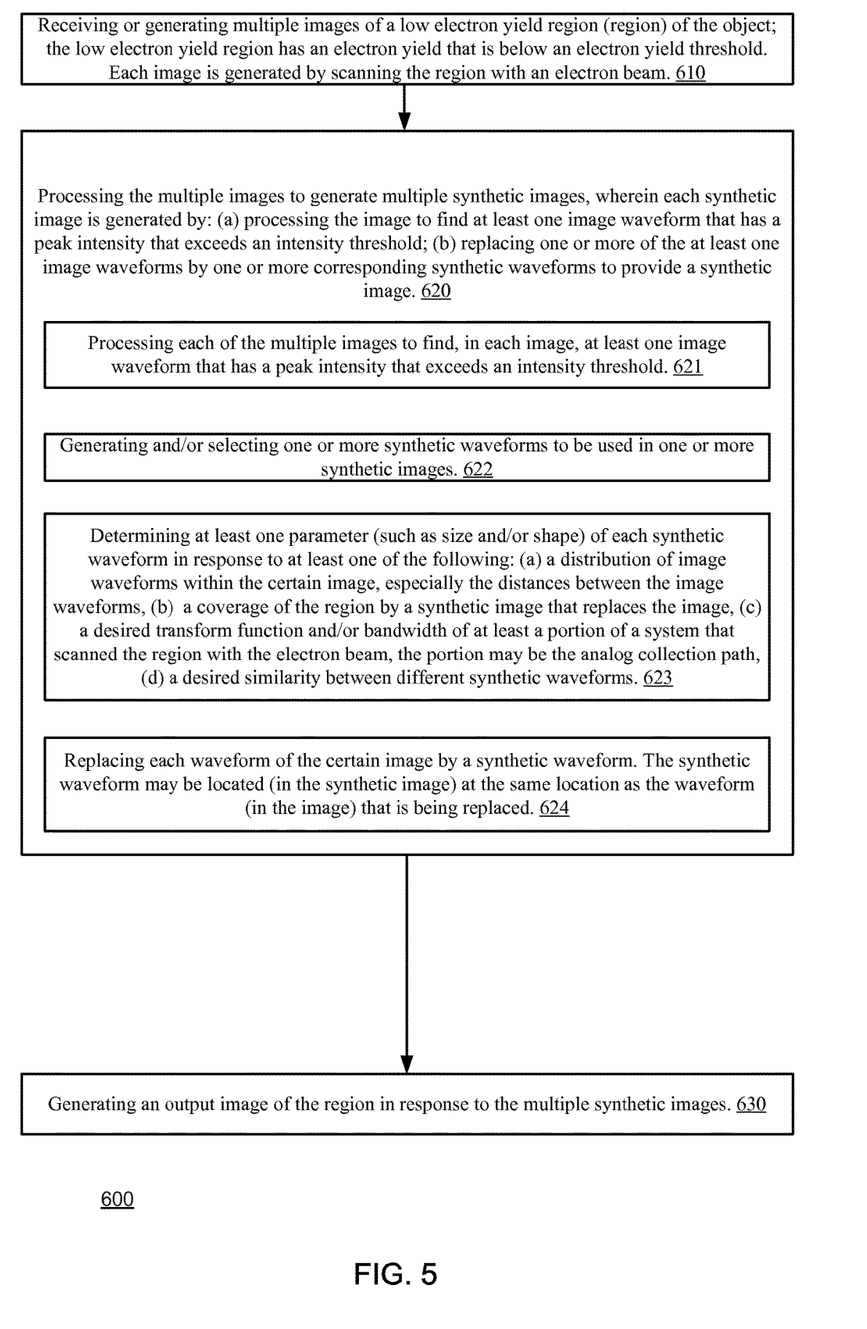
FIG. 5 illustrates a method according to an embodiment of the invention.

FIG. 5 illustrates method 600 according to an embodiment of the invention.

Method 600 may start by step 610 of receiving or generating multiple images of a low electron yield region (region) of the object; the low electron yield region has an electron yield that is below an electron yield threshold. Each image is generated by scanning the region with an electron beam.

Step 610 may be followed by step 620 of processing the multiple images to generate multiple synthetic images, wherein each synthetic image is generated by: (a) processing the image to find at least one image waveform that has a peak intensity that exceeds an intensity threshold; (b) replacing one or more of the at least one image waveforms by one or more corresponding synthetic waveforms to provide a synthetic image; wherein a synthetic waveform that replaces an image waveform is smoother than the image waveform.

Step 620 may include at least one of the following steps:
a. Processing (621) each of the multiple images to find, in each image, at least one image waveform that has a peak intensity that exceeds an intensity threshold. The intensity threshold may be set in order to filter out noises that have a peak intensity that is below a minimal peak intensity of a signal resulting from a detection of an electron. The intensity threshold may be adjusted over time. The adjustment of the intensity threshold may be responsive to evaluations about false alarms (declaring noise as a valid waveform) or evaluations about missed electrons (filtering valid signals). In some cases, a preprocessing such as a noise reducing filter or matched filter may precede the thresholding. In some cases, there are secondary peaks for each electron that pass the global threshold and we must filter them out based on their distance to a previous higher peak.
b. Generating and/or selecting (622) one or more synthetic waveforms to be used in one or more synthetic images.
c. Determining (623) at least one parameter (such as size and/or shape) of each synthetic waveform in response to at least one of the following: (a) a distribution of image waveforms within the certain image, especially the distances between the image waveforms, (b) a coverage of the region by a synthetic image that replaces the image (it may be desired not to have gaps in the synthetic image), (c) a desired transform function and/or bandwidth of at least a portion of a system that scanned the region with the electron beam, the portion may be the analog collection path, (d) a desired similarity between different synthetic waveforms (for example—all the synthetic waveforms applied in all synthetic images may be of the same shape and/or size, alternatively—at least two synthetic waveforms may differ from each other by shape and/or size). For example if there are greater distances between adjacent image waveforms than the synthetic pulses may be wider. Yet for another example, lower SNRs may require smoother synthetic waveforms. The synthetic waveforms may have a Gaussian shape, a delta function shape, a shape that approximates a transfer function of the image obtaining module 110 (or of a portion of the image obtaining module 110), and the like.
d. Using the one or more synthetic waveforms when generating the multiple synthetic images, in response to information about at least one image waveform found within each image.
e. Generating a certain synthetic image in response to one or more synthetic waveforms associated with a certain image and to information about one or more waveforms found within the certain image.
f. Replacing (624) each waveform of the certain image by a synthetic waveform. The synthetic waveform may be located (in the synthetic image) at the same location as the waveform (in the image) that is being replaced.

Step 620 may be followed by step 630 of generating an output image of the region in response to the multiple synthetic images.

Step 630 may include, for example, accumulating the multiple synthetic images (or applying any mathematical function on the multiple synthetic images) to provide the output image.

Figure 6:
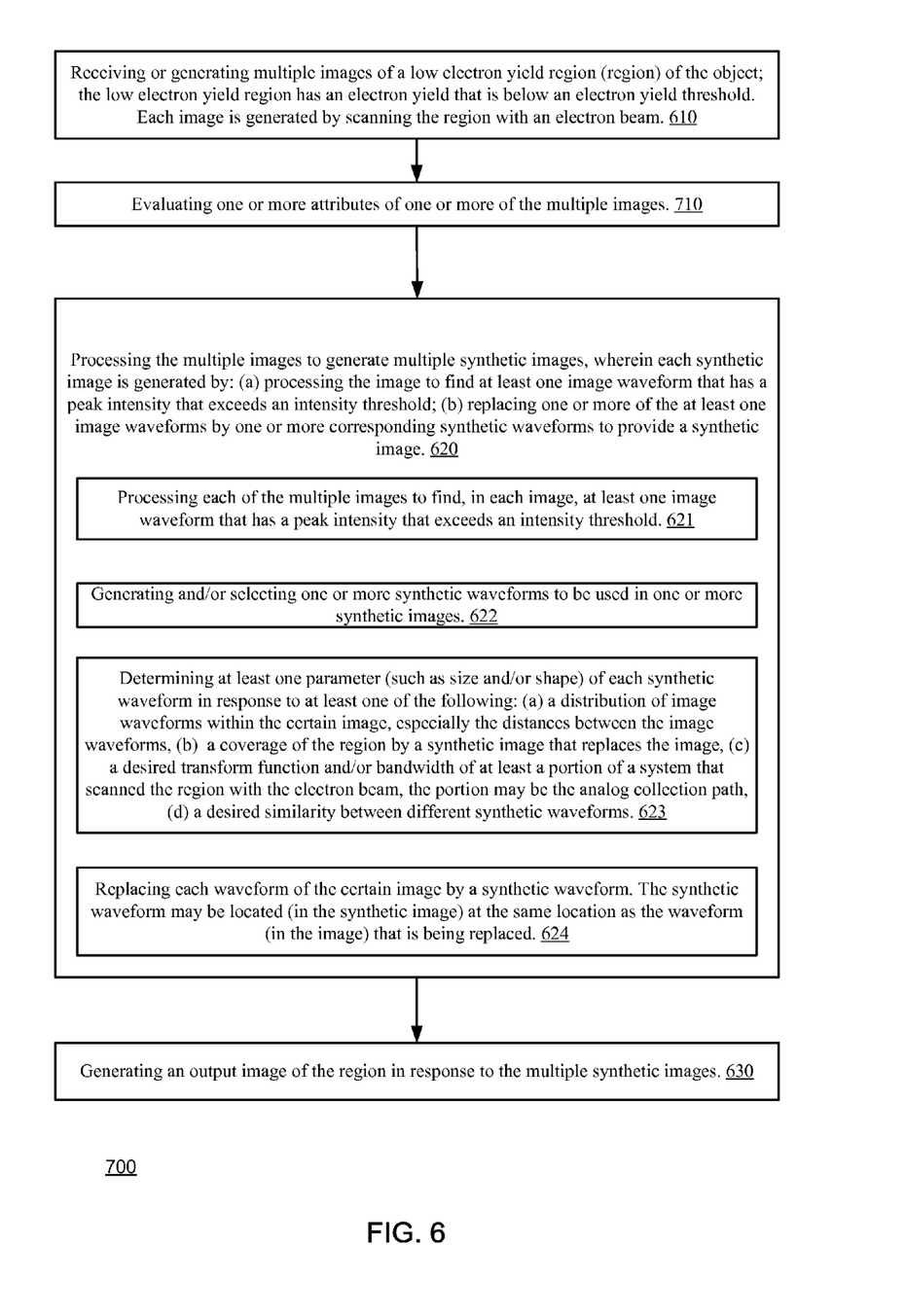
FIG. 6 illustrates a method according to an embodiment of the invention.

FIG. 6 illustrates method 700 according to an embodiment of the invention.

Method 700 differs from method 600 by including step 710 of evaluating one or more attributes of one of more of the multiple images. An attribute may be, for example, a signal to noise ratio, a smoothness of the image, and the like.

In this case step 620 (and especially step 623) may be responsive to the one or more attributes (such as signal to noise ratio) of one or more images of the multiple images.

Figure 7:
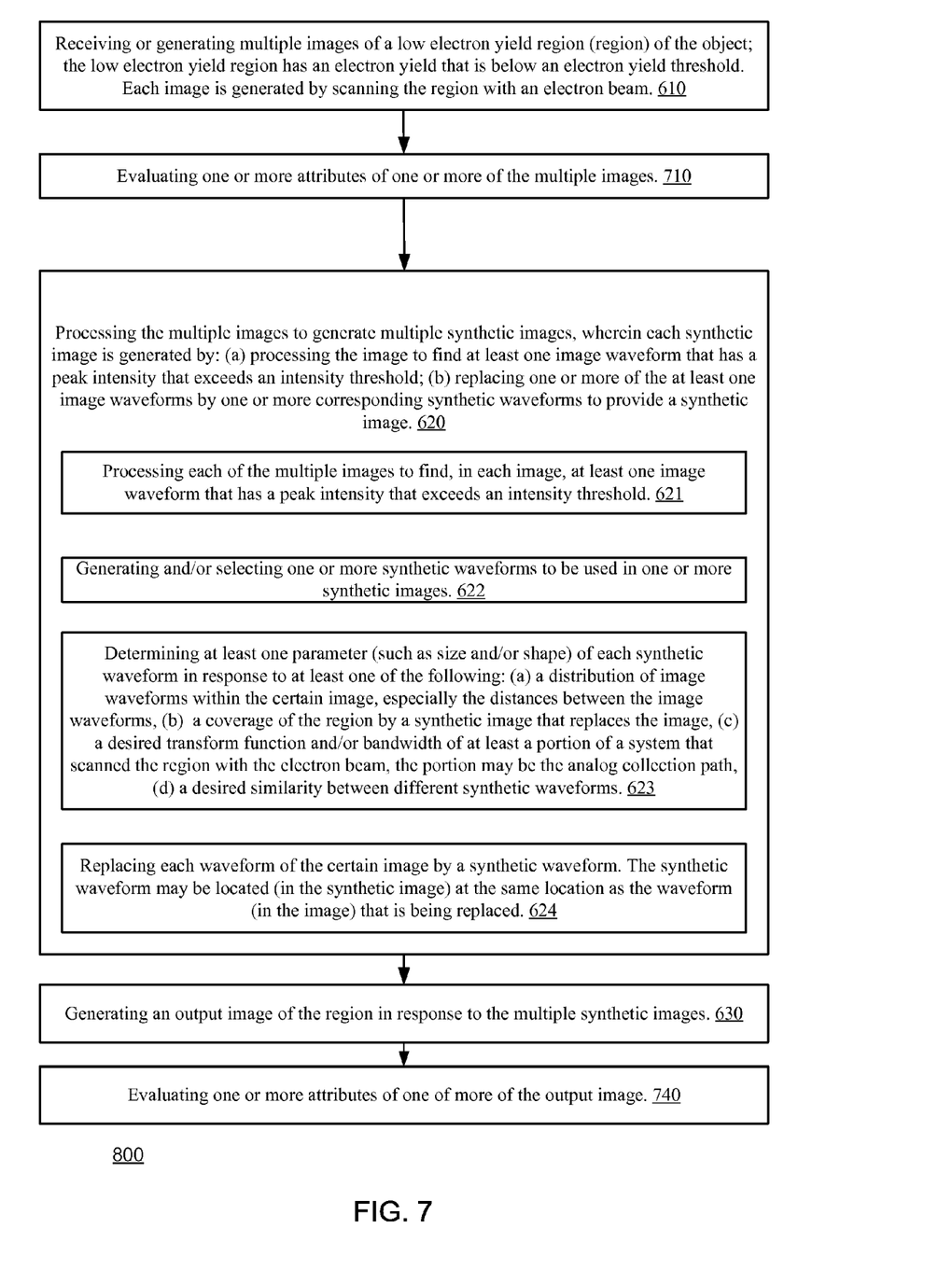
FIG. 7 illustrates a method according to an embodiment of the invention.

FIG. 7 illustrates method 800 according to an embodiment of the invention.

Method 800 differs from method 600 by including step 710 and step 740. Step 740 follows step 630 and includes evaluating one or more attributes of one of more of the output image. This evaluation may affect the generation of future synthetic waveforms. For example—if the output image exhibits a low SNR it may be beneficial to use the synthetic waveforms that were used during the generation of the synthetic images that are associated with the output image.

An area of the object that is imaged multiple times may include a low electron yield region and a high electron yield region. Each of these regions may be treated in a separate manner. The images of the low electron yield region may be processed by applying each one of method 600, 700 and 800. The images of the high electron yield region may be treated in a different manner—they may be processed (for example by applying a filter) or be left as is. The output image of the area will be generated in response to the images (acquired, synthetic, filtered) of both high and low electron yield regions.

FIG. 8 illustrates method 900 according to an embodiment of the invention.

Method 900 may start by step 910 of receiving or generating multiple images of an area that includes a first region that is a low electron yield region and a second region that is a high electron yield region.

Step 910 may be followed by step 920 of identifying, in each image, the first region (that is a low electron yield region of the object and identifying the second region (that is a high electron yield region).

Step 920 may be followed by step 930 of applying a low electron yield region processing on the images of the first region and step 940 of applying a high electron yield region processing on the second region.

Step 930 may include steps 620 and 630. It may also include steps 710 and/or 740.

Step 940 may include leaving the images of the second regions untouched, applying any mathematical operation on the images and the like.

Steps 930 and 940 are followed by step 950 of generating an output image of the area in response to the results of steps 930 and 940. Step 950 may include, for example, generating the output image in response to the multiple synthetic images (outputted by step 930) and the images (or processed images) of the second region (output of step 940).

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for imaging an object, the method comprising:
receiving or generating multiple images of a region of the object; wherein the region has a measured electron yield that has been determined to be below a predefined electron yield threshold; wherein each image is generated by scanning the region with an electron beam;
processing the multiple images to generate multiple synthetic images, wherein each synthetic image is generated by: (a) processing the image to find at least one image waveform that has a peak intensity that exceeds a predefined intensity threshold; (b) replacing one or more of the at least one image waveforms by one or more corresponding synthetic waveforms to provide a synthetic image; and
generating an output image of the region in response to the multiple synthetic images.

2. The method according to claim 1 wherein a synthetic waveform that replaces an image waveform is smoother than the image waveform.

3. The method according to claim 1 wherein at least one certain image waveform that (a) has a peak intensity that exceeds the predefined intensity threshold, and (b) belongs to a certain image of the multiple images, is generated in response to a detection of an emission of a single electron from the region.

4. The method according to claim 1 wherein each image waveform is a pulse; and wherein the method further comprises filtering out secondary oscillations associated with each pulse.

5. The method according to claim 1 further comprising determining at least one parameter of at least one synthetic image of a certain image in response to a distribution of image waveforms within the certain image.

6. The method according to claim 1 further comprising determining a width of a synthetic waveform of a certain image in response to a distance between an image waveform associated with the synthetic waveform and another image waveform of the certain image.

7. The method according to claim 1 further comprising determining at least one parameter of at least one synthetic waveform of a certain image to provide a full coverage of the region by the synthetic image.

8. The method according to claim 1 further comprising determining at least one parameter of at least one synthetic waveform of a certain image in response to a desired transform function of at least a portion of a system that scanned the region with the electron beam.

9. The method according to claim 8 wherein the portion of the system is an analog collection path of the system.

10. The method according to claim 1 further comprising determining at least one parameter of at least one synthetic waveform of a certain image in response to a desired bandwidth of at least a portion of a system that scanned the region with the electron beam.

11. The method according to claim 1 further comprising determining at least one parameter of at least one synthetic waveform of a certain image in response to a signal to noise ratio of the certain image.

12. The method according to claim 1 further comprising determining at least one parameter of at least one synthetic waveform of a certain image in response to a signal to noise ratio of at least one of the multiple images.

13. The method according to claim 1 wherein all synthetic waveforms of a certain image have a same height.

14. The method according to claim 1 wherein at least two synthetic waveforms of a certain image differ from each other by height.

15. The method according to claim 1 further comprising receiving or generating multiple images of an area of the object; wherein the area comprises the region and an additional region of the object that has an electron yield that is above the predefined electron yield threshold; wherein each image of the area is generated by scanning the area with the electron beam; wherein the generating an output image of the area is responsive to the multiple synthetic images and to multiple images of the other region.

16. The method according to claim 15 further comprising finding the region and the additional region.

17. The method according to claim 15, wherein at least one certain image waveform that (a) has a peak intensity that exceeds the predefined intensity threshold, and (b) belongs to a certain image of the region, is generated in response to a detection of an emission of a single electron from the region;

wherein each waveform of each image of the additional region is generated in response to a detection of an emission of multiple electrons from the additional region.

18. The method according to claim 1 further comprising generating each of the multiple synthetic images by utilizing one or more primitive synthetic waveforms; summing the multiple synthetic images to provide a summed image and filtering the summed image to provide the output image.

19. A non-transitory computer readable medium that stores instructions that once executed by a computer cause the computer to:

receive or generate multiple images of a region of the object; wherein the region has a measured electron yield that has been determined to be below a predefined electron yield threshold; wherein each image is generated by scanning the region with an electron beam;

process the multiple images to generate multiple synthetic images, wherein each synthetic image is generated by:
(a) processing the image to find at least one image waveform that has a peak intensity that exceeds a predefined intensity threshold; (b) replacing one or more of the at least one image waveforms by one or more corresponding synthetic waveforms to provide a synthetic image; and generate an output image of the region in response to the multiple synthetic images.

20. A system, comprising a processor, wherein the processor comprises an image waveform finder, a synthetic image generator and an output image generator; wherein the processor is configured to:

(i) receive or generate multiple images of a region of the object; wherein the region has a measured electron yield that has been determined to be below a predefined electron yield threshold; wherein each image is generated by scanning the region with an electron beam;

(ii) process the multiple images to generate multiple synthetic images, and (iii) generate an output image of the region in response to the multiple synthetic images;

wherein the image waveform finder is configured to process each image of the multiple images to find at least one image waveform that has a peak intensity that exceeds a predefined intensity threshold; wherein the synthetic image generator is configured to replace one or more of the at least one image waveforms by one or more corresponding synthetic waveforms to provide a synthetic image; and wherein the output image generator is configured to generate an output image of the region in response to the multiple synthetic images.

* * * * *